(12) United States Patent
Schroeder et al.

(10) Patent No.: US 12,068,290 B2
(45) Date of Patent: Aug. 20, 2024

(54) POWER SEMICONDUCTOR MODULE WITH LOW INDUCTANCE GATE CROSSING

(71) Applicant: Hitachi Energy Ltd, Zürich (CH)

(72) Inventors: Arne Schroeder, Bern (CH); Slavo Kicin, Zürich (CH); Fabian Mohn, Ennetbaden (CH); Juergen Schuderer, Zürich (CH)

(73) Assignee: Hitachi Energy Ltd, Zürich (CH)

( * ) Notice: Subject to any disclaimer, the term of this patent is extended or adjusted under 35 U.S.C. 154(b) by 382 days.

(21) Appl. No.: 17/611,305

(22) PCT Filed: Apr. 2, 2020

(86) PCT No.: PCT/EP2020/059408
§ 371 (c)(1),
(2) Date: Nov. 15, 2021

(87) PCT Pub. No.: WO2020/229052
PCT Pub. Date: Nov. 19, 2020

(65) Prior Publication Data
US 2022/0238493 A1    Jul. 28, 2022

(30) Foreign Application Priority Data
May 14, 2019 (EP) .................................... 19174478

(51) Int. Cl.
*H01L 25/07* (2006.01)
*H01L 23/00* (2006.01)
(Continued)

(52) U.S. Cl.
CPC ........ *H01L 25/072* (2013.01); *H01L 23/3735* (2013.01); *H01L 23/5385* (2013.01);
(Continued)

(58) Field of Classification Search
CPC ............... H01L 25/072; H01L 23/3735; H01L 23/5385; H01L 23/5386; H01L 24/32;
(Continued)

(56) References Cited

U.S. PATENT DOCUMENTS

| | | |
|---|---|---|
| 5,424,579 A | 6/1995 | Arai et al. |
| 5,705,848 A | 1/1998 | Bayerer |

(Continued)

FOREIGN PATENT DOCUMENTS

| | | |
|---|---|---|
| CN | 103117276 A | 5/2013 |
| CN | 107958905 A | 4/2018 |

(Continued)

OTHER PUBLICATIONS

Chen, Cai, et al., "A Review of SiC Power Module Packaging: Layout, Material System and Integration", CPSS Transactions on Power Electronics and Applications, vol. 2, No. 3, Sep. 2017, pp. 170-186.

(Continued)

*Primary Examiner* — Elias Ullah
(74) *Attorney, Agent, or Firm* — Slater Matsil, LLP

(57) ABSTRACT

A power semiconductor module includes a main substrate and power semiconductor chips. Each power semiconductor chip is bonded to the main conductive layer with the first power electrode. A first group of the power semiconductor chips is connected in parallel via the second power electrodes and a second group of the power semiconductor chips is connected in parallel via the second power electrodes. The module also includes a first insulation layer and a first conductive layer overlying the first insulation layer as well as a second insulation layer and a second conductive layer overlying the second insulation layer. The first conductive layer provides a first gate conductor area and a first auxiliary emitter conductor area for the first group. The second (Continued)

conductive layer provides a second gate conductor area and a second auxiliary emitter conductor area for the second group.

19 Claims, 3 Drawing Sheets

(51) Int. Cl.
  *H01L 23/373* (2006.01)
  *H01L 23/538* (2006.01)

(52) U.S. Cl.
  CPC .......... *H01L 23/5386* (2013.01); *H01L 24/32* (2013.01); *H01L 24/49* (2013.01); *H01L 2224/48091* (2013.01); *H01L 2224/49111* (2013.01); *H01L 2224/73265* (2013.01); *H01L 2924/19107* (2013.01)

(58) Field of Classification Search
  CPC ........... H01L 24/49; H01L 2224/48091; H01L 2224/49111; H01L 2224/73265; H01L 2924/19107; H01L 2224/0603; H01L 2224/4903; H01L 2224/49113; H01L 2224/49431; H01L 23/49844; H01L 25/18
  See application file for complete search history.

(56) References Cited

U.S. PATENT DOCUMENTS

| | | |
|---|---|---|
| 8,987,777 B2 | 3/2015 | Hauenstein |
| 2010/0065962 A1 | 3/2010 | Bayerer et al. |
| 2013/0082373 A1 | 4/2013 | Duetemeyer et al. |
| 2015/0115288 A1 | 4/2015 | Tamada et al. |
| 2015/0371937 A1 | 12/2015 | Yoshihara et al. |
| 2016/0056132 A1* | 2/2016 | Bayerer ............... H01L 25/072 257/784 |
| 2017/0338162 A1 | 11/2017 | Cottet et al. |
| 2018/0247923 A1 | 8/2018 | Hartmann et al. |

FOREIGN PATENT DOCUMENTS

| | | |
|---|---|---|
| CN | 108475668 A | 8/2018 |
| EP | 0805494 A2 | 11/1997 |
| JP | H0645509 A | 2/1994 |
| JP | 2001135789 A | 5/2001 |
| JP | 2010021188 A | 1/2010 |
| JP | 2010027691 A | 2/2010 |
| JP | 2016122869 A | 7/2016 |
| JP | 2017208547 A | 11/2017 |
| WO | 2013089242 A1 | 6/2013 |
| WO | 2014014012 A1 | 1/2014 |
| WO | 2015176985 A1 | 11/2015 |
| WO | 2018007062 A1 | 1/2018 |
| WO | 2018109069 A1 | 6/2018 |

OTHER PUBLICATIONS

Hoene, Eckart, et al., "Ultra-Low-Inductance Power Module for Fast Switching Semiconductors", Materials Science, Jan. 2013, pp. 198-205.

Regnat, G. et al., "Optimized Power Modules for Silicon Carbide MOSFET", IEEE Energy Conversion Congress and Exposition (ECCE 2016), Milwaukee, WI, USA, Sep. 2016, 9 pages.

Takao, Kazuto, et al., "Ultra Low Inductance Power Module for Fast Switching SiC Power Devices", Proceedings of the 27th International Symposium on Power Semiconductor Devices & IC's, May 10-14, 2015, 4 pages.

Tanimoto, Satoshi, et al., "High Junction Temperature and Low Parasitic Inductance Power Module Technology for Compact Power Conversion Systems", IEEE Transactions on Electron Devices, vol. 62, No. 2, Feb. 2015, pp. 258-269.

* cited by examiner

POWER SEMICONDUCTOR MODULE WITH LOW INDUCTANCE GATE CROSSING

CROSS-REFERENCE TO RELATED APPLICATIONS

This application is a national stage application of International Application No. PCT/EP2020/059408, filed on Apr. 2, 2020, which claims priority to European Patent Application No. 19174478.8, filed on May 14, 2019, which applications are hereby incorporated herein by reference.

TECHNICAL FIELD

The invention relates to the field of packaging of power semiconductors and, in particular embodiments, to a power semiconductor module.

BACKGROUND

Half bridge power modules form the key building blocks in various power electronic devices, such as motor drives or power inverters. New modules can involve silicon carbide (SiC) semiconductors, which may exhibit an enhanced performance over conventional silicon (Si) semiconductors: SiC devices offer a high power density. Furthermore, there is an increasing need for low inductance module layouts to avoid voltage overshoots and potential destruction of the SiC devices, as the switching speed of SiC devices is usually much higher than that of Si devices.

The switching performance of a module is mainly determined by the commutation loop inductance of the module. Moreover, the inductances of gate connections and the mutual inductance between commutation loop and gate loop may affect the switching performance. In order to fully exploit fast switching capability of SiC devices, these inductances should be as low as possible. In case of paralleled semiconductor chips, individual inductances may also have to be well balanced.

PCT publication WO 2018 109 069 A1 shows a power semiconductor module with two gate paths that partially run parallel to each other in a conductive layer of an additional substrate.

U.S. Pat. No. 5,705,848 A relates to a power semiconductor module and mentions that stacked layers of insulating material and conducting track layers results in a low stray inductance.

SUMMARY

Embodiments of the invention can provide a compact power semiconductor module with a low gate path inductance.

In one embodiment, a power semiconductor module includes a main substrate with a main conductive layer separated into conductive areas and power semiconductor chips. Each power semiconductor chip has a first power electrode, a second power electrode and a gate electrode. Each power semiconductor chip is bonded to the main conductive layer with the first power electrode. A first group of the power semiconductor chips is connected in parallel via the second power electrodes and a second group of the power semiconductor chips is connected in parallel via the second power electrodes. A first insulation layer and a first conductive layer are disposed on the first insulation layer. The first conductive layer provides a first gate conductor area electrically connected to the gate electrodes of the first group and a first auxiliary emitter conductor area electrically connected to power electrodes of the first group. A second insulation layer and a second conductive layer are disposed on the second insulation layer. The second conductive layer provides a second gate conductor area electrically connected to the gate electrodes of the second group and a second auxiliary emitter conductor area electrically connected to power electrodes of the second group. The main conductive layer, the first insulation layer, the first conductive layer, the second insulation layer and the second conductive layer are stacked with respect to each other.

BRIEF DESCRIPTION OF THE DRAWINGS

The subject-matter of the invention will be explained in more detail in the following text with reference to exemplary embodiments which are illustrated in the attached drawings.

The reference symbols used in the drawings, and their meanings, are listed in summary form in the list of reference symbols. In principle, identical parts are provided with the same reference symbols in the figures.

Figure 1:
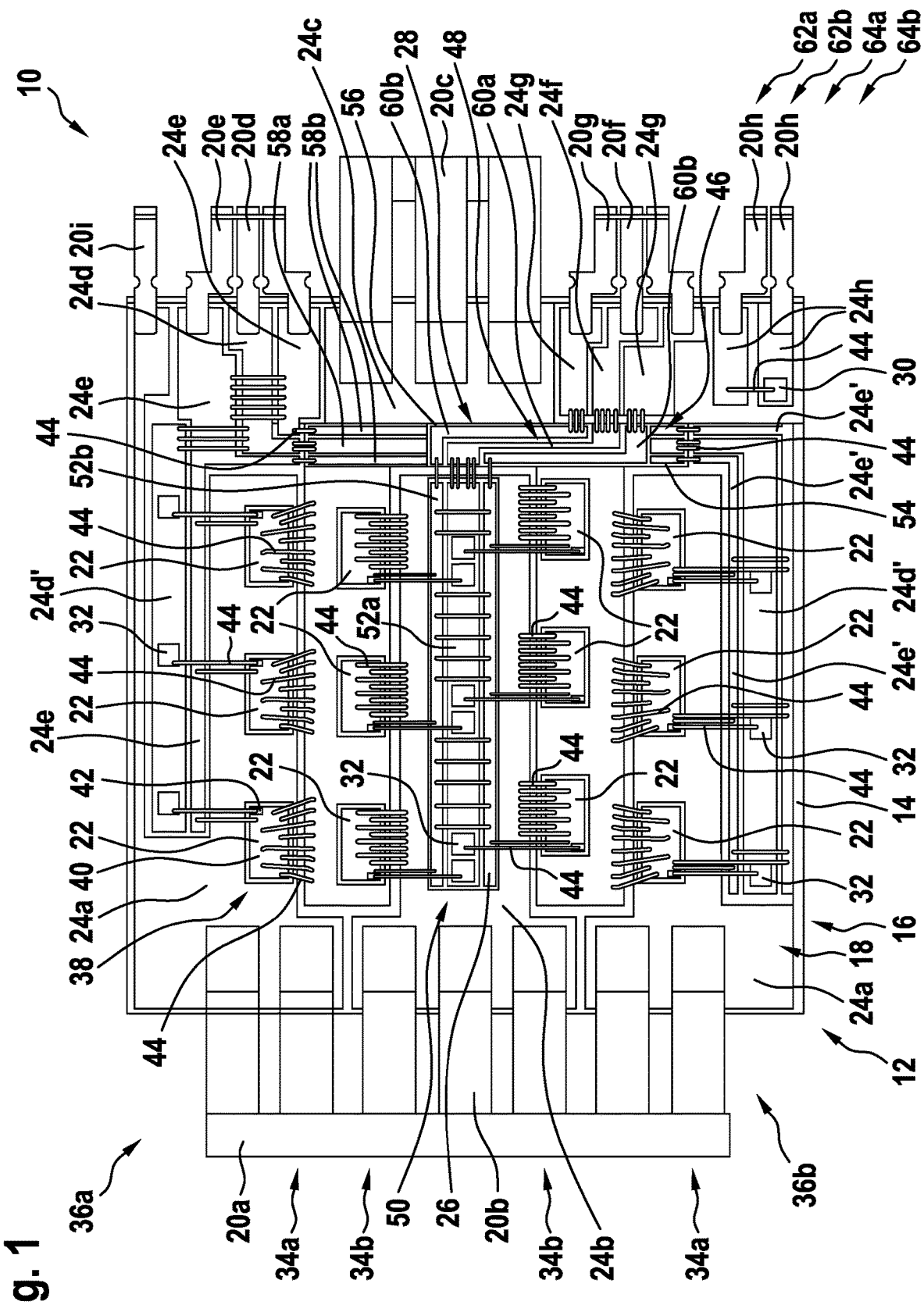
FIG. 1 schematically shows a top view of a power semiconductor module according to an embodiment of the invention.

The following reference symbols can be used in conjunction with the drawings:

10 power semiconductor module
12 substrate
14 insulation layer
16 lower conductive layer
18 main conductive layer
20a DC+ terminal
20b DC− terminal
20c AC terminal
20d high-side gate terminal
20e high-side auxiliary emitter terminal
20f low-side gate terminal
20g low-side auxiliary emitter terminal
20h temperature sensor terminal
20i auxiliary collector terminal
22 power semiconductor chip
24a DC+ area
24b DC− area
24c AC area
24d high-side gate area
24d' further high-side gate area
24e high-side auxiliary emitter area
24e' further high-side auxiliary emitter area
24f low-side gate area
24g low-side auxiliary emitter area
24h temperature sensor area
26 low-side gate substrate
28 control substrate
30 temperature sensor
32 resistor
34a outer row
34b inner row
36a first group
36b second group 38 first power electrode
40 second power electrode
42 gate electrode
44 wirebond
46 first conductive layer
48 second conductive layer
50 conductive layer
52a gate area
52b auxiliary emitter area
54 first insulation layer
56 second insulation layer
56' further insulation layer
58a first gate area
58b first auxiliary emitter area
60a second gate area
60b second auxiliary emitter area
62a first gate conductor
62b second gate conductor
64a first auxiliary emitter conductor
64b second auxiliary emitter conductor
66 intermediate conductive layer
68 third conductive layer

DETAILED DESCRIPTION OF ILLUSTRATIVE EMBODIMENTS

Embodiments of the invention provide a compact power semiconductor module with a low gate path inductance.

A power semiconductor module may be a device, which mechanically and electrically interconnects one or more power semiconductor chips with electrical conductors and terminals, such that the power semiconductor module can be used as a building block for larger machines, such as rectifiers, inverters, electrical drives, etc. In particular, the power semiconductor module may be used in an electrical inverter of an electrical or hybrid vehicle, i.e., for generating an AC voltage for an electrical motor from a DC voltage from a battery. The term "power" in power semiconductor module and/or power semiconductor chip may relate to the ability to process currents of more than 10 A and/or more than 100 V.

According to an embodiment of the invention, the power semiconductor module comprises a main substrate with a main conductive layer separated into conductive areas. For example, the main substrate may be a DBC (direct bonded copper) substrate. The main substrate may comprise an insulation layer that may be made of ceramics onto which the conductive layer is deposited, which may be made of copper.

According to an embodiment of the invention, the power semiconductor module comprises power semiconductor chips. Each power semiconductor chip has a first power electrode, a second power electrode and a gate electrode. Each power semiconductor chip is bonded to the main conductive layer with the first power electrode. A first group of the power semiconductor chips is connected in parallel via the second power electrodes and a second group of the power semiconductor chips is connected in parallel via the second power electrodes. The power semiconductor chips may be SiC chips. The power electrodes may be emitter and collector electrodes. The power electrodes may cover substantially a side of the chip. At one side, the chip may be covered by a power electrode and the gate electrode.

The chips may be interconnected to form a half-bridge. The first group of chips may form the high-side switch or the low-side switch of the half-bridge. The second group of chips may form the other one of the high-side switch or the low-side switch.

According to an embodiment of the invention, the power semiconductor module comprises a first control conductor electrically connected to one of the first electrode, the second electrode or the gate electrode of the power semiconductor chips of the first group and a second control conductor electrically connected to one of the first electrode, the second electrode or the gate electrode of the power semiconductor chips of the second group. For example, the first control conductor and the second control conductor may be gate conductors. However, it is also possible that one or both of the control conductors are auxiliary emitter conductors or conductors for guiding other signals.

Each control conductor may comprise control conductor areas of the main conductive layer. To these conductor areas, the chips and/or terminals of the module may be connected.

According to an embodiment of the invention, the power semiconductor module comprises a first insulation layer and a first conductive layer on the first insulation layer, wherein at least a part of the first control conductor is provided by at least a part of the first conductive layer, and a second insulation layer and a second conductive layer on the second insulation layer, wherein at least a part of the second control conductor is provided by at least a part of the second conductive layer.

The first control conductor may connect an electrode (such as one of the power electrodes or the gate electrode) with a first control terminal. Analogously, the second control conductors may connect an electrode (such as one of the power electrodes or the gate electrode) with a second control terminal. The first control conductor may be seen as a first control trace of the module. The second control conductor may be seen as a second control trace of the module.

The control conductor areas of the main substrate may be connected to the first and second conductive areas. The first insulation layer may be attached to the main conductive layer of the main substrate and the second insulation layer may be attached to the first conductive layer on the first insulation layer.

According to an embodiment of the invention, the main conductive layer, the first insulation layer, the first conductive layer, the second insulation layer and the second conductive layer are stacked with respect to each other. From a view onto the substrate, the first and second conductive layers (as well as the main conductive area) may overlap each other, which may decrease the area of the module used for the control conductors.

The stacked conductive layers, which are electrically isolated from each other, may be seen as a multilevel control conductor arrangement.

Furthermore, with the stacked conductive layers, a crossing of the paths of the control conductors may be achieved. The crossing may be achieved without lengthy wirebonds, which would have to span over other parts of the module.

With such an arrangement, the power density of, for example SiC half-bridge, power semiconductor modules may be increased. A high power density may be achieved by reducing the space required by control conductors, such as gate traces, which, for example, connect the semiconductor gates with the module terminals.

Additionally with the arrangement of the control conductors, the thermal properties of the module may be increased without changing the substrate size. Alternatively, the substrate size may be reduced while the thermal performance is kept. When the control conductors are gate conductors, a low-inductance gate connection may be achieved, as may be required for fast switching devices.

By using a multilevel control conductor arrangement, the module area occupied by the control conductors may be significantly reduced. Accordingly, the total substrate size may be decreased while the area for chips may be kept constant. With that, the power density may be enhanced which may be an important step towards highly compact module layouts for space demanding applications.

Instead of decreasing the substrate size, the module area for chip placement may be increased. With that, the heat transfer resistance may be decreased, leading to an improved cooling efficiency. A higher cooling efficiency may enhance the current rating of the module. Alternatively, a larger module area also may facilitate the placement of more chips, which would increase the current capability accordingly.

In the end, using a multilevel arrangement of the control conductors may offer a low inductive and space-saving alternative as design basis and hence may reduce design efforts.

The multilayer arrangement may be provided with one, two or more additional substrates attached to the main substrates.

For example, the first insulation layer and the first conductive layer may be provided by a first substrate. The second insulation layer and the second conductive layer may be provided by a second substrate. The first substrate and/or the second substrate may be a DBC (direct bonded copper) substrate, DBA (direct bonded aluminum) substrate, an AMB (Active metal bracing) ceramic substrate, a PCB (printed circuit board), a LTCC (Low Temperature Cofired Ceramics) substrate, a laminated busbar, a flex foils, etc.

Alternatively, the first insulation layer, the first conductive layer, the second insulation layer and the second conductive layer may be provided by one substrate, such as a multilayer circuit board. Using a separate multilevel substrate, for example manufactured as PCB, in combination with a DBC main substrate may combine cheap and established multilevel PCB technology for temperature uncritically parts (such as gate traces), with a DBC main substrate with superior thermal properties.

According to an embodiment of the invention, the first conductive layer comprises a first elongated strip and the second conductive layer comprises a second elongated strip. A strip may be a part of the conductive layer, which is at least 5 times longer than wide. The strips may be part of control conductor traces through the module.

The first elongated strip, i.e. a part of the first control conductor, and the second elongated strip, i.e. a part of the second control conductor, may run parallel to each other. This may decrease the inductance of control loops, since their effective area coupling to magnetic fields may be decreased.

In general, the multilayer control conductor arrangement may be used in different trace topologies. For example, each of the first and second conductive layer may comprise a single signal trace without kelvin emitter, i.e. an auxiliary emitter conductor connecting the emitters of the power semiconductors of one group with an auxiliary emitter terminal. It also may be possible that each of the first and second conductive layer comprises a gate conductor trace and an auxiliary emitter trace. It also is possible that the control conductors are arranged such that two emitter traces are arranged besides (or above and below) a gate trace, which may result in a coaxial arrangement of the emitter traces and the gate trace.

According to an embodiment of the invention, the first control conductor is a first gate conductor and is electrically connected to the gate electrodes of the first group of the power semiconductor chips. Also, the second control conductor may be a second gate conductor and may be electrically connected to the gate electrodes of the second group of the power semiconductor chips. For example, in both cases, the electrical connection may be made further a gate conductor area of the main conductive layer of the main substrate, which may be connected via wirebonds with the respective first and second conductive layer.

It may be that the first group of chips forms the high-side switch of a half-bridge and that the second group of chips forms the low-side switch of a half-bridge (and vice versa). The first gate conductor and/or the first conductive layer may be electrically connected to the gates of the first groups of chips, i.e. to the high-side switch or low-side switch. The second gate conductor and/or the second conductive layer may be electrically connected to the gates of the second groups of chips, i.e. to the low-side switch or high-side switch.

According to an embodiment of the invention, the first control conductor is a gate conductor electrically connected to the gate electrodes of the first or the second group of power semiconductor chips and the second control conductor is an auxiliary emitter conductor electrically connected to one of the first and the second power electrodes of the first or the second group of power semiconductor chips. The emitter conductor may be connected to the emitter electrode of the respective chip. It may be that a gate conductor and an emitter conductor, both connected to the same group of chips, are guided stacked on each other. It further may be that the emitter conductor is guided above the gate conductor, i.e. on a higher level as the gate conductor with respect to the main substrate.

According to an embodiment of the invention, the first control conductor is an auxiliary emitter conductor electrically connected to one of the first and the second power electrodes of the first or the second group of power semiconductor chips and the second control conductor is a gate conductor electrically connected to the gate electrodes of the first or the second group of power semiconductor chips. It may be that the emitter conductor is guided below the gate conductor, i.e. on a lower level as the gate conductor with respect to the main substrate.

According to an embodiment of the invention, the first conductive layer provides a first gate conductor area and a first auxiliary emitter conductor area. The second conductive layer may provide a second gate conductor area and a second auxiliary emitter conductor area. In this arrangement, the gate conductor area and the emitter conductor area may be arranged besides each other. The gate conductor area and the emitter conductor area may be arranged on the same level with respect to the main substrate.

According to an embodiment of the invention, the first gate conductor area and the second gate conductor area are stacked with each other. The gate conductors may overlap each other, when seen from a view above the module. Also, the first auxiliary emitter conductor area and the second auxiliary emitter conductor area may be stacked with each other. The auxiliary emitter conductors may overlap each other, when seen from a view above the module.

According to an embodiment of the invention, the first auxiliary emitter conductor area is provided on both sides of the first gate conductor area. Also, the second auxiliary emitter conductor area may be provided on both sides of the second gate conductor area. In other words, the auxiliary emitter conductor areas and the corresponding gate conductor areas may be arranged coaxially in parallel to the main substrate.

According to an embodiment of the invention, the first conductive layer provides a first auxiliary emitter conductor area electrically connected to power electrodes of the first group and a second auxiliary emitter conductor area connected to power electrodes of the second group. In this arrangement, auxiliary emitter conductor areas for different groups of chips may be arranged on one level with respect to the main substrate.

According to an embodiment of the invention, the second conductive layer provides a first gate conductor area electrically connected to the gate electrodes of the first group and a second gate conductor area connected to the gate electrodes of the second group. In this arrangement, gate conductor areas for different groups of chips may be arranged on one level with respect to the main substrate.

According to an embodiment of the invention, the first gate conductor area and the first auxiliary emitter conductor area are stacked with each other and/or the second gate conductor area and the second auxiliary emitter conductor area are stacked with each other. In other words, gate conductor areas for different groups of chips may be arranged on a first level with respect to the main substrate and the auxiliary emitter conductor areas for the different groups of chips may be arranged on a second level with respect to the main substrate.

According to an embodiment of the invention, the power semiconductor module further comprises a third conductive layer stacked with the first conductive layer and the second conductive layer, the third conductive layer providing one or more third conductive areas. In general, it may be possible that more than two stacked conductive layers are used for transmitting control signals.

According to an embodiment of the invention, the first conductive layer provides a first auxiliary emitter conductor area and a second auxiliary emitter conductor area. The second conductive layer may provide a first gate conductor and a second gate conductor area. The third conductive layer may provide a third auxiliary emitter conductor area electrically connected to the first auxiliary emitter conductor area and a fourth auxiliary emitter conductor area electrically connected to the second auxiliary emitter conductor area.

The first auxiliary emitter conductor area, the first gate conductor area and the third auxiliary emitter conductor area may be stacked with each other. In such a way, the first and third auxiliary emitter conductor areas and the corresponding first gate conductor areas may be arranged coaxially in a direction orthogonal to the main substrate.

Also, the second auxiliary emitter conductor area, the second gate conductor area and the fourth auxiliary emitter conductor area may be stacked with each other. In such a way, the second and fourth auxiliary emitter conductor areas and the corresponding second gate conductor areas may be arranged coaxially in a direction orthogonal to the main substrate.

According to an embodiment of the invention, an intermediate conductive layer is arranged between the first conductive layer and the second conductive layer. This intermediate conductive layer may electrically shield the first conductive layer and the second conductive layer from each other.

The intermediate conductive layer may be electrically floating. This may mean that the intermediate conductive layer is electrically disconnected from other parts of the module. The intermediate layer may also be on a defined potential, for example for auxiliary power supply. The intermediate layer may also be connected to a control trace and/or may be adapted for and/or used for conducting a control signal.

According to an embodiment of the invention, the main conductive layer of the main substrate comprises a first control conductor area providing a part of the first control conductor. The first control conductor area may be a first gate conductor area or a first auxiliary emitter conductor area. The first control conductor area may be connected via at least one wirebond with the first conductive layer.

According to an embodiment of the invention, the main conductive layer of the main substrate comprises a second control conductor area providing a part of the second control conductor. The second control conductor area may be a second gate conductor area or a second auxiliary emitter conductor area. The second control conductor may be connected via at least one wirebond with the second conductive layer.

These wirebonds need not span above other conductors. The wirebonds may interconnect conductive layers arranged directly besides each other, which may result in short wirebonds and in low inductance.

According to an embodiment of the invention, the main conductive layer comprises a main layer gate conductor area and two main layer auxiliary emitter conductor areas, which are arranged on two sides of the main layer gate conductor area. These conductor areas of the main substrate may be arranged coaxially on the main substrate.

According to an embodiment of the invention, the main layer gate conductor area and one of the first and the second gate conductor area are electrically interconnected, wherein the main layer auxiliary emitter conductor areas and one of the first and the second auxiliary emitter conductor areas are electrically interconnected. This connection may be done via wirebonds, which also may be short, since they connect directly neighbouring conductive areas.

According to an embodiment of the invention, the main layer gate conductor area and the main layer auxiliary emitter conductor areas are arranged such that they face towards the one of the first and the second gate conductor area and the one of the first and the second auxiliary emitter conductor areas. In other words, corresponding conductors of coaxial conductor arrangement may be placed side by side, such an interconnection per wirebonds may become short.

According to an embodiment of the invention, the power semiconductor chips are arranged in parallel rows and the first conductive layer and the second conductive layer are arranged on a side of the rows and run orthogonal to the rows. One or more rows may provide the first group of chips and/or one or more rows may provide the second group of chips. The stacked control conductor arrangement may be placed besides these rows and may be used for collecting control signals of different rows. In particular, when control terminals are arranged opposite to the rows of chips, the stacked control conductor arrangement may be used for distributing the control signals from the terminals to different rows. The stacked first and second conductive layer provides a crossing of the control signal paths.

According to an embodiment of the invention, the first group of power semiconductor chips are arranged in two parallel first rows and the second group of power semiconductor chips are arranged in two second parallel rows, which are arranged between the first rows. The second group may be a low-side of a half-bridge and the first group may be the high-side of a half-bridge. In such a way, the chips may be arranged coaxially and/or a current path through the module may be composed of two loops, which have an opposite current orientation.

First main layer gate conductor areas of the main conductive layer may be arranged outside of the rows of semiconductor chips and are electrically connected to the first conductive layer. The first conductive layer may be electrically connected to all gates of the chips of the first group. The first conductive layer also may be electrically connected to a first gate terminal of the module.

A second main layer gate conductor area may be arranged between the second rows of semiconductor chips and is electrically connected to the second conductive layer. The second main layer gate conductor area may be provided by a substrate attached onto the main substrate. The second main layer conductive area may be electrically connected to all gates of the second group of chips. The second main layer conductive layer also may be electrically connected to a second gate terminal of the module.

In such a way, the gate signal distribution may be very compact and may have a low inductance.

These and other aspects of the invention will be apparent from and elucidated with reference to the embodiments described hereinafter with respect to the drawings.

FIG. 1 shows a power semiconductor module 10 with a main substrate 12, which is composed of an insulation layer 14 (for example made of ceramics) sandwiched between two conductive layers 16, 18 (for example made of copper). The lower conductive layer 16 may be used for attaching a cooling body to the module 10.

To the upper conductive layer 18, which may be seen as main conductive layer 18, several terminals 20 and power semiconductor chips 22 are bonded. The conductive layer 18 is structured into several conductive areas 24, which are separated from each other with respect to the substrate (but which may be electrically interconnected with each other via further members of the module 10). Furthermore, to the conductive layer 18, several additional substrates 26, 28, a temperature sensor 30 and resistors 32 are bonded.

The temperature sensor 30 may be bonded to a first temperature sensor area 24h of the conductive layer 18 and electrically connected via a wirebond 44 with a second temperature sensor area 24h. To both temperature sensor areas 24h, a respective terminal 20h is bonded.

The power semiconductor chips 22 are arranged in four rows 34a, 34b, wherein the two outer rows 34a are connected in parallel into a first group 36a and form a high-side switch of a half-bridge and the two inner rows 34b are connected in parallel into a second group 36b and form a low-side switch of the half-bridge.

Each power semiconductor chip 22 has a first power electrode 38 (a collector electrode) on the side bonded to the main conductive layer 18 and a second power electrode 40 (an emitter electrode) on the opposite side, on which also a gate electrode 42 is arranged. Due to reasons of clarity in FIG. 1, only one chip 22 has been provided with reference numerals for the electrodes 38, 40, 42.

The chips 22 of the outer rows 34a (i.e. of the first group 36a forming the high-side switch) are bonded to two DC+ areas 24a of the main conductive layer 18, to which also a DC+ terminal 20a is bonded, which electrically interconnects the DC+ areas 24a with each other.

With their second power electrodes 40m, the chips 22 of the outer rows 34a are electrically connected via wirebonds 44 (only some of which are referenced in FIG. 1) to an AC area 24c of the main conductive layer 18. The AC area 24c is U-shaped and arranged within the DC+ areas 24a. To the AC area 24c at a side opposite to the DC+ terminal 20a, an AC terminal 20c is bonded.

The chips 22 of the inner rows 34b (i.e. of the second group 36b forming the low-side switch) are bonded with their first power electrode 38 to the AC area 24c and in particular to the arms of the U. These chips 22 are electrically via wirebonds 44 connected with their second power electrode 40 to a DC− area 24b, which is arranged within the arms of the U of the AC area 24c. On the side of the module 10, where the DC+ terminal 20 is arranged, also a DC− terminal 20b is bonded to the DC− area 24b.

Due to the arrangement of the terminals 20a, 20b, 20c and the areas 24a, 24b, 24c, a current path through the module 10 in two oppositely directed current loops is generated, which substantially lowers the overall inductance of the module 10.

On the side of the module 10, where the AC terminal 20c is arranged, further control terminals 20d, 20e, 20f, 20g, 20i are provided.

One of the DC+ areas 24a runs to the side of the module 10, where the terminals 20c, 20d, 20e, 20g, 20f, 20h are arranged. There, an auxiliary collector terminal 20i is bonded to the DC+ area 24a.

A high-side gate terminal 20d is bonded to a high-side gate area 24d and a high-side auxiliary emitter terminal 20e is bonded to two high-side auxiliary emitter areas 24e, which are arranged on two sides of the high-side gate area 24d to form a coaxial arrangement with low inductance.

Analogously, on the opposite side of the AC terminal 20c, a low-side gate terminal 20f is bonded to a low-side gate area 24f and a low-side auxiliary emitter terminal 20g is bonded to two low-side auxiliary emitter areas 24g, which are arranged on two sides of the low-side gate area 24f to form a further coaxial arrangement with low inductance.

These two coaxial terminal and conductor arrangements are electrically connected to the emitter electrodes 40 and gate electrodes 42 of the chips 22 with further coaxial arrangement, which are partially provided by the further substrates 26, 28.

A further high-side gate area 24d' of the layer 18 is provided outside of the rows 34a of chips 22. To this gate area 24d, the gate electrodes 42 of the chips 22 of the rows 34a (i.e. of the first group 36a) are electrically connected via a wirebond 44 and a resistor 32. The emitter electrodes 40 of these chips are connected via a bond wire to the high-side auxiliary emitter area 24e or to further high-side auxiliary emitter areas 24e', which are arranged on one or both sides of the further high-side gate area 24d'.

The further high-side gate area 24d' and the further high-side auxiliary emitter areas 24e' are electrically connected via wirebonds 44 with areas of a first conductive layer 46 of the control substrate 28, which is attached to the module 10 above the AC area 24c besides the rows 34a, 34b.

The gate electrodes 42 of the rows 34b of chips 22 are connected to a gate area 52a of a conductive layer 50 of the low-side gate substrate 26. The emitter electrodes 40 of the rows 34b of chips 22 are connected to two auxiliary emitter areas 52b of the conductive layer 50. The auxiliary emitter areas 52b are arranged on two sides of the gate area 52a to form a coaxial arrangement with low inductance.

The low-side gate substrate 26 is attached to the DC− area 24b and runs parallel to the rows 34b and/or between these rows 34b. Also, the longitudinal and/or elongated areas 52a, 52b run in this direction.

The conductive layer 50 of the low-side gate substrate 26 is provided on an insulation layer of the low-side gate substrate 26, which insulation layer is attached to the DC-area 24b.

The gate area 52a and the auxiliary emitter areas 52b are electrically connected via wirebonds 44 with areas of a second conductive layer 48 of the control substrate 28, which second conductive layer 48 is arranged above the first conductive layer of the control substrate 28. Also the low-side gate area 24f and the low-side auxiliary emitter area 24g are electrically connected via wirebonds 44 with the second conductive layer 48.

The control substrate 28 has a first insulation layer 54, which is attached to the main substrate 12 and/or the main conductive layer 18. In particular, the first insulation layer is attached to the AC area 24c. The first conductive layer 46 is attached to and/or provided on the first insulation layer 54. A second insulation layer 56 of the control substrate 28 is attached to the first conductive layer 46. The second conductive layer 48 is attached to and/or provided on the second insulation layer 56.

In general, the main conductive layer 18, and the layers 54, 46, 56, 48 are stacked with respect to each other in this order.

For example, the control substrate 28 may be a multilayer PCB, which provides all the layers 54, 46, 56, 48. Also, the control substrate 28 may be made of a first and a second substrate, wherein the first substrate provides the first insulation layer 54 and the first conductive layer 46 and the second substrate provides the second insulation layer 56 and the second conductive layer 48.

The first conductive layer 46 is separated into a first gate area 58a and two first auxiliary emitter areas 58b, which run at two sides of the first gate area 58a to form a coaxial arrangement. Analogously, the second conductive layer 48 is separated into a second gate area 60a and two second auxiliary emitter areas 60b, which run at two sides of the second gate area 60a to form a coaxial arrangement.

Note that in the above and in the following, the term "first" may relate to the high-side part of the half-bridge formed by the module 10 and the term "second" may relate to the low-side part of the half-bridge. For example, the first gate area 58a may be a high-side gate area and the second gate area 60a may be a low-side gate area.

The areas 58a, 58b, 60a, 60b are elongated strips or tracks, which run substantially parallel to each other. The direction of these strips or tracks may be orthogonal to the direction of the rows 34a, 34b of chips.

The first gate area 58a is electrically connected (for example via wirebonds 44) with the conductive areas 24d and 24d'. All these areas form a first gate conductor 62a.

The first auxiliary emitter areas 58b are electrically connected (for example via wirebonds 44) with the conductive areas 24e and 24d'. All these areas form a first auxiliary emitter conductor 64a.

The first gate conductor 62a and the first auxiliary emitter conductor 64a both may be seen as first control conductors of the module 10.

The second gate area 60a is electrically connected (for example via wirebonds 44) with the conductive areas 24f and 52a. All these areas form a second gate conductor 62b.

The second auxiliary emitter areas 60b are electrically connected (for example via wirebonds 44) with the conductive areas 24g and 52b. All these areas form a second auxiliary emitter conductor 64b.

The second gate conductor 62b and the second auxiliary emitter conductor 64b both may be seen as second control conductors of the module 10.

Figure 2:
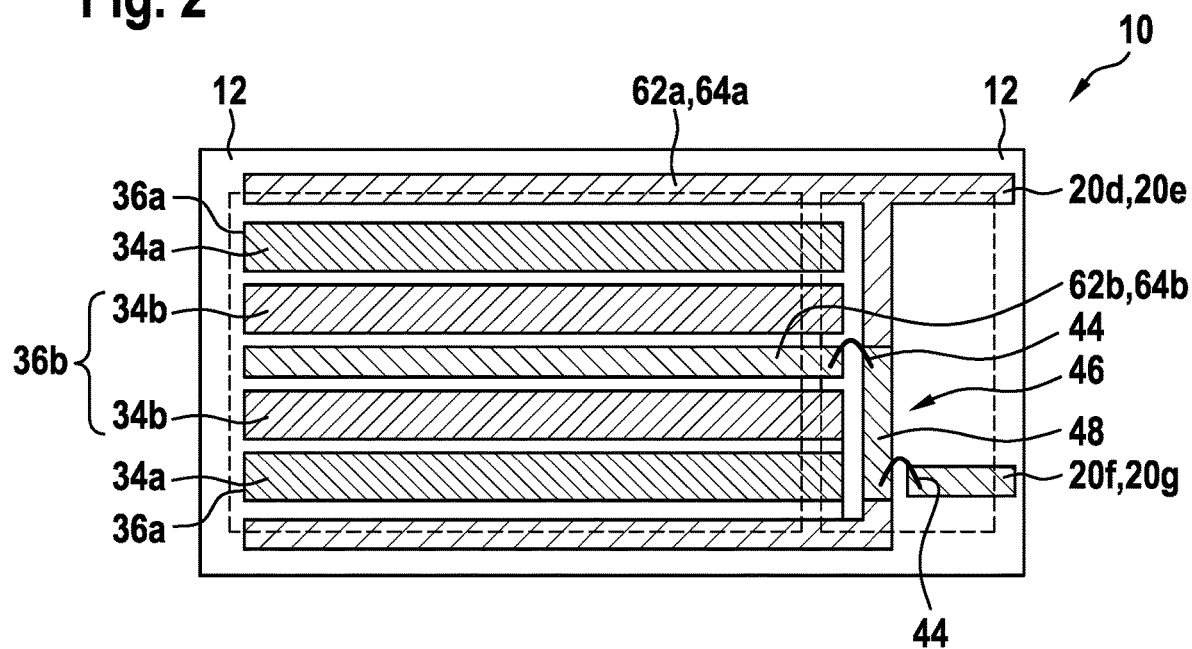
FIG. 2 schematically shows a top view of a power semiconductor module according to a further embodiment of the invention.

FIG. 2 illustrates the stacked arrangement of the first control conductor 62a, 64a and the second control conductor 62b, 64b in a more schematic way.

In FIG. 2, the groups 36a, 36b and rows 34a, 34b of chips are depicted. The emitter (second power) electrodes 40 and/or the gate electrodes 42 of the chip 22 of the first group 36a may be connected via the first control conductor 62a, 64a with the respective terminal 20d, 20e. Due to the arrangement of the chips 22 in the rows 34a, 34b, the first control conductor 62a, 64a forks from the terminal 20d, 20e into two arms, which run along the two outer rows 34a.

On the other hand, the emitter (second power) electrodes 40 and/or the gate electrodes 42 of the chip 22 of the second group 36b may be connected via the second control conductor 62b, 64b with the respective terminal 20f, 20g. Due to the arrangement of the chips 22 in the rows 34a, 34b, the second control conductor 62a, 64a coming from the terminal 20f, 20g crosses the first control conductor 62a, 64a to run along the two inner rows 34b.

The crossing is implemented with the first conductive layer 46 and the second conductive layer 48, which are stacked with respect to each other. Furthermore, the conductive layers 46, 48 run along each other and/or overlap each other, which may reduce the gate loop inductance.

Due to the stacked conductive layers 46, 48, the wirebonds 44 needed for interconnecting parts of the control conductors 62a, 64a, 62b, 64b may be rather short, since they do not need to span over longer distances but may interconnect neighbouring conductive areas.

Figure 3:
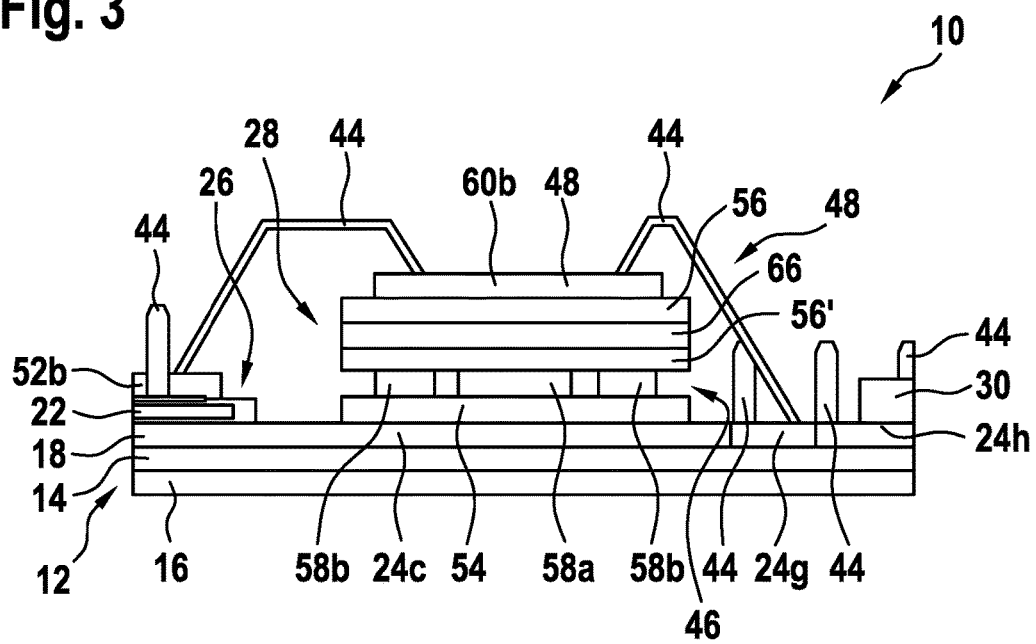
FIG. 3 shows a side view of a part of the power semiconductor module of FIG. 1.

FIG. 3 shows a side view of a part of the module 10 of FIG. 1 with the control substrate 28. It is shown, that an intermediate conductive layer 66 may be arranged between the first conductive layer 46 and the second conductive layer 48.

The intermediate layer 66, which may be made of Cu, may be sandwiched between two insulation layers 56, 56', which may be made of ceramics, and may be electrically floating. This may electrically shield the first conductive layer 46 and the second conductive layer 48 from each other.

FIG. 4A to 4D show possible arrangements of gate conductor areas 58a, 60a and auxiliary emitter conductor areas 58b, 60b, 58c, 60c, which alternatively may be used in the embodiments shown in FIGS. 1 to 3. It has to be noted that additionally also the corresponding areas electrically connected with the first group 36a and/or the high-side switch may be exchanged with the areas electrically connected with the second group 36b and/or the low-side switch.

Figure 4A:
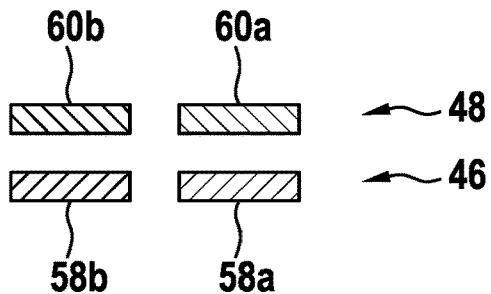
FIGS. 4A, 4B, 4C and 4D schematically illustrate arrangements of control conductor areas, which may be used in the modules shown in FIGS. 1 and 2.

FIG. 4A shows an embodiment, where the gate conductor areas 58a, 60a are provided in the same layer 46, 48 as the corresponding auxiliary emitter conductor areas 58b, 60b. Furthermore, solely one auxiliary emitter conductor area 58b, 60b is provided per layer 46, 48. The first gate conductor area 58a and the second gate conductor area 60a may be stacked with each other and/or the first auxiliary emitter conductor area 58b and the second auxiliary emitter conductor area 60b may be stacked with each other.

Figure 4B:
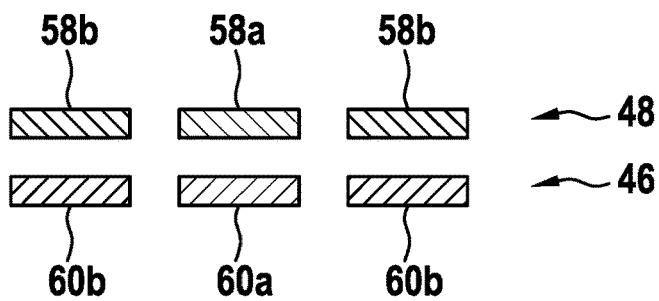

FIG. 4B shows the embodiment of FIGS. 1 and 3, where the gate conductor areas 58a, 60a are provided in the same layer 46, 48 as two corresponding auxiliary emitter conductor areas 58b, 60b, which are arranged on both sides of the gate conductor areas 58a, 60a. The first auxiliary emitter conductor area 58b may be provided on both sides of the first gate conductor area 58a and/or the second auxiliary emitter conductor area 60b may be provided on both sides of the second gate conductor area 60a.

Figure 4C:
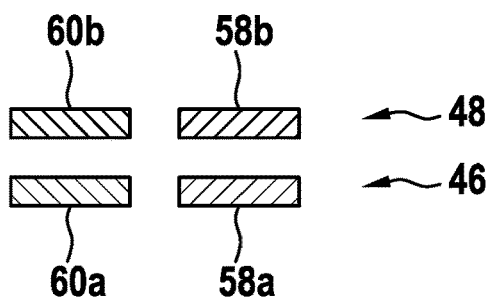

FIG. 4C shows an embodiment, where the gate conductor areas 58a, 60a are provided in different layers 46, 48 as the corresponding auxiliary emitter conductor areas 58b, 60b.

For example, the first conductive layer 46 may provide a first gate conductor area 58a electrically connected to the gate electrodes 42 of the first group 36a and a second gate conductor area 60a connected to the gate electrodes 42 of the second group 36b. The second conductive layer 48 may provide a first auxiliary emitter conductor area 58b electrically connected to power electrodes 38, 40 of the first group 36a and a second auxiliary emitter conductor area 60b connected to power electrodes 38, 40 of the second group 36b. However, here also the first conductive layer 46 and the second conductive layer 48 may be exchanged.

The first gate conductor area 58a and the first auxiliary emitter conductor 60a area may be stacked with each other and/or the second gate conductor area 60a and the second auxiliary emitter conductor area 60b may be stacked with each other.

Figure 4D:
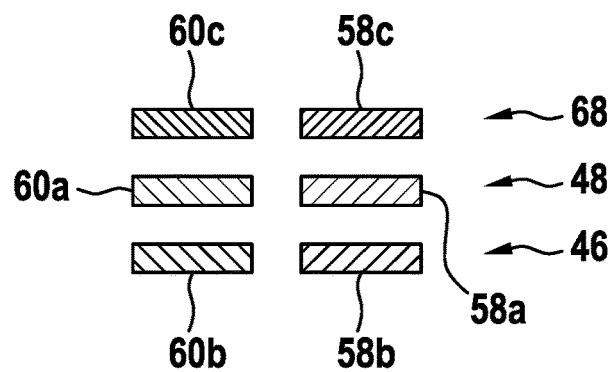

FIG. 4D shows an embodiment with a third conductive layer 68, which is stacked with the first conductive layer 46 and the second conductive layer 48. A further insulation layer may be provided between the third conductive layer 68 and the second conductive layer 48.

As the first conductive layer 46 and the second conductive layer 48, the third conductive layer may provide one or more conductive areas 58c, 60c, which may be used as a part of the control conductors 62a, 64a, 62b, 64b.

In FIG. 4D, the conducting areas are arranged to form a coaxial arrangement in a direction orthogonal to an extension direction of the layers 46, 48, 68.

The first conductive layer 46 provides a first auxiliary emitter conductor 58b area and a second auxiliary emitter conductor area 60b. The second conductive layer 48 provides a first gate conductor area 58a and a second gate conductor area 60a. The third conductive layer provides a third auxiliary emitter conductor area 58c electrically connected to the first auxiliary emitter conductor area 58a and a fourth auxiliary emitter conductor area 60c electrically connected to the second auxiliary emitter conductor area 60a.

The first auxiliary emitter conductor area 58b, the first gate conductor area 58a and the third auxiliary emitter conductor 58c area may be stacked with each other and/or the second auxiliary emitter conductor area 60b, the second gate conductor area 60a and the fourth auxiliary emitter conductor area 60c may be stacked with each other.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art and practising the claimed invention, from a study of the drawings, the disclosure, and the appended claims. In the claims, the word "comprising" does not exclude other elements or steps, and the indefinite article "a" or "an" does not exclude a plurality. A single processor or controller or other unit may fulfill the functions of several items recited in the claims. The mere fact that certain measures are recited in mutually different dependent claims does not indicate that a combination of these measures cannot be used to advantage.

The invention claimed is:

1. A power semiconductor module, comprising:
a main substrate with a main conductive layer separated into conductive areas;
a plurality of power semiconductor chips, wherein each power semiconductor chip has a first power electrode, a second power electrode, and a gate electrode, wherein each power semiconductor chip is bonded to the main conductive layer with the first power electrode and wherein a first group of the power semiconductor chips is connected in parallel via the second power electrodes and a second group of the power semiconductor chips is connected in parallel via the second power electrodes;
a first insulation layer attached to the main conductive layer;
a first conductive layer provided on the first insulation layer, wherein the first conductive layer provides a first gate conductor area electrically connected to the gate electrodes of the first group and a first auxiliary emitter conductor area electrically connected to power electrodes of the first group;
a second insulation layer attached to the first conductive layer; and
a second conductive layer provided on the second insulation layer, wherein the second conductive layer provides a second gate conductor area electrically connected to the gate electrodes of the second group and a second auxiliary emitter conductor area electrically connected to power electrodes of the second group;
wherein the main conductive layer, the first insulation layer, the first conductive layer, the second insulation layer and the second conductive layer are stacked with respect to each other.

2. The power semiconductor module of claim 1,
wherein the first gate conductor area and the second gate conductor area are stacked with each other; and
wherein the first auxiliary emitter conductor area and the second auxiliary emitter conductor area are stacked with each other.

3. The power semiconductor module of claim 1, wherein the first auxiliary emitter conductor area is provided on both sides of the first gate conductor area and wherein the second auxiliary emitter conductor area is provided on both sides of the second gate conductor area.

4. The power semiconductor module of claim 1,
wherein the first conductive layer comprises a first elongated strip and the second conductive layer comprises a second elongated strip; and
wherein the first elongated strip and the second elongated strip run parallel to each other.

5. The power semiconductor module of claim 1, further comprising a third conductive layer stacked with the first conductive layer and the second conductive layer, the third conductive layer providing third conductive areas.

6. The power semiconductor module of claim 1, further comprising an intermediate conductive layer arranged between the first conductive layer and the second conductive layer, wherein the intermediate conductive layer is electrically floating.

7. The power semiconductor module of claim 1,
wherein the main conductive layer of the main substrate comprises a first control conductor area providing a part of a first control conductor;
wherein the first control conductor area is connected via at least one wirebond with the first conductive layer;
wherein the main conductive layer of the main substrate comprises a second control conductor area providing a part of a second control conductor; and wherein the second control conductor area is connected via at least one wirebond with the second conductive layer.

8. The power semiconductor module of claim 1, wherein the power semiconductor chips are arranged in parallel rows and the first conductive layer and the second conductive layer are arranged on a side of the rows and run orthogonal to the rows.

9. The power semiconductor module of claim 1,
wherein the power semiconductor chips of the first group are arranged in two parallel first rows and the power semiconductor chips of the second group are arranged in two second parallel rows, which are arranged between the first rows;
wherein first main layer gate conductor areas of the main conductive layer are arranged outside of the rows of semiconductor chips and are electrically connected to the first conductive layer; and
wherein a second main layer gate conductor area is arranged between the second rows of semiconductor chips and is electrically connected to the second conductive layer.

10. A power semiconductor module, comprising:
a main substrate with a main conductive layer separated into conductive areas;
a plurality of power semiconductor chips, wherein each power semiconductor chip has a first power electrode, a second power electrode, and a gate electrode, wherein each power semiconductor chip is bonded to the main conductive layer with the first power electrode, and wherein a first group of the power semiconductor chips is connected in parallel via the second power electrodes and a second group of the power semiconductor chips is connected in parallel via the second power electrodes;
a first insulation layer attached to the main conductive layer;
a first conductive layer provided on the first insulation layer, wherein the first conductive layer provides a first auxiliary emitter conductor area electrically connected to power electrodes of the first group and a second auxiliary emitter conductor area electrically connected to power electrodes of the second group;
a second insulation layer attached to the first conductive layer; and
a second conductive layer provided on the second insulation layer, wherein the second conductive layer provides a first gate conductor area electrically connected to the gate electrodes of the first group and a second gate conductor area electrically connected to the gate electrodes of the second group;
wherein the main conductive layer, the first insulation layer, the first conductive layer, the second insulation layer and the second conductive layer are stacked with respect to each other.

11. The power semiconductor module of claim 10,
wherein the first gate conductor area and the first auxiliary emitter conductor area are stacked with each other; and
wherein the second gate conductor area and the second auxiliary emitter conductor area are stacked with each other.

12. The power semiconductor module of claim 10, wherein a third conductive layer provides a third auxiliary emitter conductor area electrically connected to the first auxiliary emitter conductor area and a fourth auxiliary emitter conductor area electrically connected to the second auxiliary emitter conductor area.

13. The power semiconductor module of claim 12,
wherein the first auxiliary emitter conductor area, the first gate conductor area and the third auxiliary emitter conductor area are stacked with each other; and
wherein the second auxiliary emitter conductor area, the second gate conductor area and the fourth auxiliary emitter conductor area are stacked with each other.

14. The power semiconductor module of claim 12,
wherein the main conductive layer comprises a main layer gate conductor area and two main layer auxiliary emitter conductor areas, which are arranged on two sides of the main layer gate conductor area;
wherein the main layer gate conductor area and one of the first and the second gate conductor area are electrically interconnected;
wherein the main layer auxiliary emitter conductor areas and one of the first and the second auxiliary emitter conductor areas are electrically interconnected; and
wherein the main layer gate conductor area and the third auxiliary emitter conductor area are arranged such that they face towards the one of the first and second gate conductor area and the one of the first and second auxiliary emitter conductor areas.

15. The power semiconductor module of claim 10,
wherein the first conductive layer comprises a first elongated strip and the second conductive layer comprises a second elongated strip; and
wherein the first elongated strip and the second elongated strip run parallel to each other.

16. The power semiconductor module of claim 10, further comprising a third conductive layer stacked with the first conductive layer and the second conductive layer, the third conductive layer providing third conductive areas.

17. The power semiconductor module of claim 10, further comprising an intermediate conductive layer arranged between the first conductive layer and the second conductive layer, wherein the intermediate conductive layer is electrically floating.

18. The power semiconductor module of claim 10,
wherein the main conductive layer of the main substrate comprises a first control conductor area providing a part of a first control conductor;
wherein the first control conductor area is connected via at least one wirebond with the first conductive layer;
wherein the main conductive layer of the main substrate comprises a second control conductor area providing a part of a second control conductor; and
wherein the second control conductor area is connected via at least one wirebond with the second conductive layer.

19. The power semiconductor module of claim 10, wherein the power semiconductor chips are arranged in parallel rows and the first conductive layer and the second conductive layer are arranged on a side of the rows and run orthogonal to the rows.

* * * * *